(12) United States Patent
Meng et al.

(10) Patent No.: US 7,977,138 B1
(45) Date of Patent: Jul. 12, 2011

(54) OPTICAL DEVICE AND METHOD OF MANUFACTURING THE SAME

(75) Inventors: Hu Meng, Osaka (JP); Hiroto Osaki, Osaka (JP); Tetsushi Nishio, Osaka (JP); Kiyokazu Itoi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/929,795

(22) Filed: Feb. 16, 2011

Related U.S. Application Data

(63) Continuation of application No. 12/209,233, filed on Sep. 12, 2008, now Pat. No. 7,911,018.

(30) Foreign Application Priority Data

Oct. 30, 2007 (JP) ................................ 2007-281052
Apr. 16, 2008 (JP) ................................ 2008-106274

(51) Int. Cl.
*H01L 21/00* (2006.01)
*H01L 21/50* (2006.01)
*H01L 21/48* (2006.01)
*H01L 31/0203* (2006.01)

(52) U.S. Cl. ............ 438/55; 438/54; 438/106; 438/118; 257/433; 257/434; 257/E21.499

(58) Field of Classification Search .................... 438/55, 438/54, 106, 118; 257/433, 434, E21.499
See application file for complete search history.

(56) References Cited

U.S. PATENT DOCUMENTS

| | | | |
|---|---|---|---|
| 4,178,611 A | 12/1979 | Okano | |
| 5,072,284 A | 12/1991 | Tamura et al. | |
| 5,122,861 A | 6/1992 | Tamura et al. | |
| 5,264,393 A | 11/1993 | Tamura et al. | |
| 5,352,852 A * | 10/1994 | Chun ............................ | 174/533 |
| 6,512,219 B1 | 1/2003 | Webster et al. | |
| 6,661,084 B1 * | 12/2003 | Peterson et al. .............. | 257/680 |
| 6,667,543 B1 | 12/2003 | Chow et al. | |
| 6,882,021 B2 | 4/2005 | Boon et al. | |
| 7,083,999 B2 | 8/2006 | Hashimoto | |
| 7,112,864 B2 | 9/2006 | Tsukamoto et al. | |
| 7,154,053 B2 | 12/2006 | Hsu | |
| 7,268,417 B2 | 9/2007 | Ochi et al. | |
| 7,276,393 B2 | 10/2007 | Derderian et al. | |
| 7,279,782 B2 | 10/2007 | Yang et al. | |
| 2003/0098912 A1 | 5/2003 | Hosokai et al. | |
| 2004/0113286 A1 | 6/2004 | Hsieh et al. | |
| 2005/0258350 A1 | 11/2005 | Van Arendonk | |
| 2006/0043555 A1 | 3/2006 | Liu | |
| 2006/0121184 A1 | 6/2006 | Minamio et al. | |
| 2007/0181792 A1 | 8/2007 | Yoshimoto et al. | |
| 2007/0196954 A1 | 8/2007 | Teshirogi et al. | |
| 2007/0200944 A1 | 8/2007 | Takeuchi et al. | |

(Continued)

FOREIGN PATENT DOCUMENTS

CN 1453860 A 11/2003

(Continued)

*Primary Examiner* — Luan C Thai

(74) *Attorney, Agent, or Firm* — Steptoe & Johnson LLP

(57) ABSTRACT

An optical device includes a semiconductor substrate (11) on which a light receiving part (12) (or a light emitting part) and electrodes (13) are formed, and a translucent plate (2) bonded on the light receiving part (12) with a translucent adhesive (5), the semiconductor substrate (11) having a plurality of convex portions (31) formed so as to separate the light receiving part (12) and the electrodes (13) and have proper gaps (32) therebetween.

10 Claims, 9 Drawing Sheets

U.S. PATENT DOCUMENTS

2008/0023809 A1   1/2008   Wu et al.

FOREIGN PATENT DOCUMENTS

| JP | 53-119063 | 10/1978 |
| JP | 2-229453 | 9/1990 |
| JP | 03151666 A | 6/1991 |
| JP | 06334159 A | 12/1994 |
| JP | 09-213725 | 8/1997 |
| JP | 2003-163342 | 6/2003 |
| JP | 2003-280549 | 10/2003 |
| JP | 3675402 | 5/2005 |
| JP | 2006-165180 | 6/2006 |
| JP | 2006351559 A | 12/2006 |
| JP | 2007-150266 | 6/2007 |
| JP | 2007-214360 | 8/2007 |

* cited by examiner

OPTICAL DEVICE AND METHOD OF MANUFACTURING THE SAME

FIELD OF THE INVENTION

The present invention relates to an optical device and a method of manufacturing the same.

BACKGROUND OF THE INVENTION

Among typical optical devices, for example, a solid-state image device made up of a solid-state image element uses an optical low-pass filter which interrupts unnecessary high frequency components and includes an optical crystal plate. In order to reduce the size and weight of a device, an optical low-pass filter using a diffraction grating is used (for example, see Japanese Patent Laid-Open No. 53-119063).

Such an optical low-pass filter has to be precisely positioned on the imaging surface of a solid-state image element. However, it is not always easy to precisely perform positioning on the order of μm. Thus, it is not possible to sufficiently prevent the occurrence of a diffraction grating image on a screen and the productivity is hard to increase. As a solution to this problem, as shown in FIG. 10, it has been proposed that a solid-state image element 1 and an optical low-pass filter 2 are fixed via a gap regulator 3 to regulate a gap between the solid-state image element 1 and the optical low-pass filter 2, so that precise positioning is performed on the order of μm (for example, see Japanese Patent Laid-Open No. 6-334159).

On the other hand, as to a package structure of a solid-state image device, a directly bonded structure has been proposed (for example, see Japanese Patent Laid-Open No. 3-151666) instead of a hollow structure of the prior art (see FIG. 10). In the directly bonded structure, a translucent plate is directly bonded to the light receiving part (or the light emitting part) of a semiconductor substrate with a translucent adhesive. An advantage of the directly bonded structure is that the sensitivity of the solid-state image device can be increased by equalizing the refractive indexes of the translucent plate, the translucent adhesive, and the flat film of the semiconductor substrate. The directly bonded structure can easily reduce the size and thickness of a package and also prevent process dust and mobile dust from entering the light receiving part.

Thus, it is considered that in the configuration of an optical device such as a solid-state image device (light receiving device) and an LED device (light emitting device), the directly bonded structure can be used in which the translucent plate is directly bonded on one of the light receiving part and the light emitting part with the translucent adhesive and the gap regulator can be used to precisely position one of the light receiving part and the light emitting part and the translucent plate or to stop the flow of the translucent adhesive.

However, for example, in the configuration of a solid-state image device shown in FIG. 11, when a translucent plate 2 such as an optical low-pass filter is placed, a translucent adhesive 5 applied on a light receiving part 12a of a semiconductor substrate 11 by a single-point application method is largely pressed out of linearly convex portions 3, particularly out of the center of the convex portions 3 as shown in FIG. 12A, so that the translucent adhesive 5 adheres to electrodes 13 disposed on the ends of the semiconductor substrate 11. When the translucent adhesive 5 is applied to two points on the light receiving part 12a as shown in FIG. 12B, it is possible to prevent the translucent adhesive 5 from being pressed out of the convex portions 3. However, air is trapped between the translucent adhesive 5 on the two points and causes internal voids. As a solution to such voids, an underfill method is effective, that is, it is effective to flow the translucent adhesive 5 by using a capillary phenomenon while setting the translucent plate 2 on the convex portions 3. However, as shown in FIG. 13, the translucent adhesive 5 flows out of the translucent plate 2 (and the convex portions 3).

DISCLOSURE OF THE INVENTION

The present invention is devised in view of these problems. An object of the present invention is to provide an optical device and a method of manufacturing the same which can prevent a translucent adhesive from flowing to electrodes and suppress voids between a semiconductor substrate and a translucent plate, the optical device having a directly bonded structure having the translucent plate directly bonded to one of the light receiving part and the light emitting part of the semiconductor substrate.

In order to attain the object, an optical device of the present invention includes: a semiconductor substrate on which one of a light receiving part and a light emitting part and electrodes are formed, and a translucent plate bonded on one of the light receiving part and the light emitting part with a translucent adhesive, the semiconductor substrate having a plurality of convex portions formed so as to separate one of the light receiving part and the light emitting part and the electrodes and have proper gaps therebetween.

Further, a method of manufacturing an optical device according to the present invention includes the steps of: forming a plurality of convex portions on a semiconductor substrate on which one of a light receiving part and a light emitting part and electrodes are formed, the convex portions separating one of the light receiving part and the light emitting part and the electrodes and having proper gaps therebetween; supplying a liquid translucent adhesive onto one of the light receiving part and the light emitting part of the semiconductor substrate having the plurality of convex portions; disposing a translucent plate on one of the light receiving part and the light emitting part of the semiconductor substrate having the plurality of convex portions; and bonding the translucent plate on one of the light receiving part and the light emitting part by curing the translucent adhesive between the semiconductor substrate and the translucent plate.

With this configuration, by providing a directly bonded structure in which the translucent plate is directly bonded to one of the light receiving part and the light emitting part of the semiconductor substrate, it is possible to increase sensitivity, reduce the size and thickness of a package, and prevent dust from entering one of the light receiving part and the light emitting part. Further, the convex portions can hold back a flow of the translucent adhesive to the electrodes. With the gaps between the convex portions, air trapped in the translucent adhesive can be released through the gaps and internal voids can be suppressed when either one of a two-point application method and an underfill method using a capillary phenomenon is used. Further, the gaps having proper widths allow surface tension to act on the translucent adhesive flowing into the gaps and thus the translucent adhesive does not flow out of the convex portions.

The plurality of convex portions may be arranged in a direction of separating the electrodes and one of the light receiving part and the light emitting part, according to the positions of the electrodes on the semiconductor substrate. For example, the plurality of convex portions can be arranged along the ends of one of the light receiving part and the light emitting part. It is preferable that the plurality of convex portions are arranged along at least two sides of one of the light receiving part and the light emitting part and have even heights and the translucent plate is disposed on one of the light receiving part and the light emitting part via the plurality of convex portions. This is because the convex portions can regulate a gap between one of the light receiving part and the light emitting part and the translucent plate and enable precise positioning.

It is preferable that both ends of the arrangement of the convex portions are disposed inside the end sides of the translucent plate, the end sides being orthogonal to the arrangement direction of the convex portions. With this configuration, when the underfill method is used, the surface tension of the translucent adhesive allows the translucent adhesive to flow onto one of the light receiving part and the light emitting part without flowing out of the rows of the convex portions supporting the translucent plate, thereby preventing the translucent adhesive from flowing out of the convex portions.

It is preferable that the convex portions each have a side facing one of the light receiving part and the light emitting part and the side is shorter than the other side of the convex portion in plan view. Thus, the gaps between the convex portions are tapered such that the inner ends are larger than the outer ends, more reliably releasing air trapped in the translucent adhesive. These shapes are particularly desirable for the two-point application method. The convex portions preferably have round top surfaces.

DESCRIPTION OF THE EMBODIMENTS

An embodiment of the present invention will be described below with reference to the accompanying drawings. A solid-state image device and an LED device will be described as optical devices and an optical device is not particularly limited to these devices.

Figure 1:
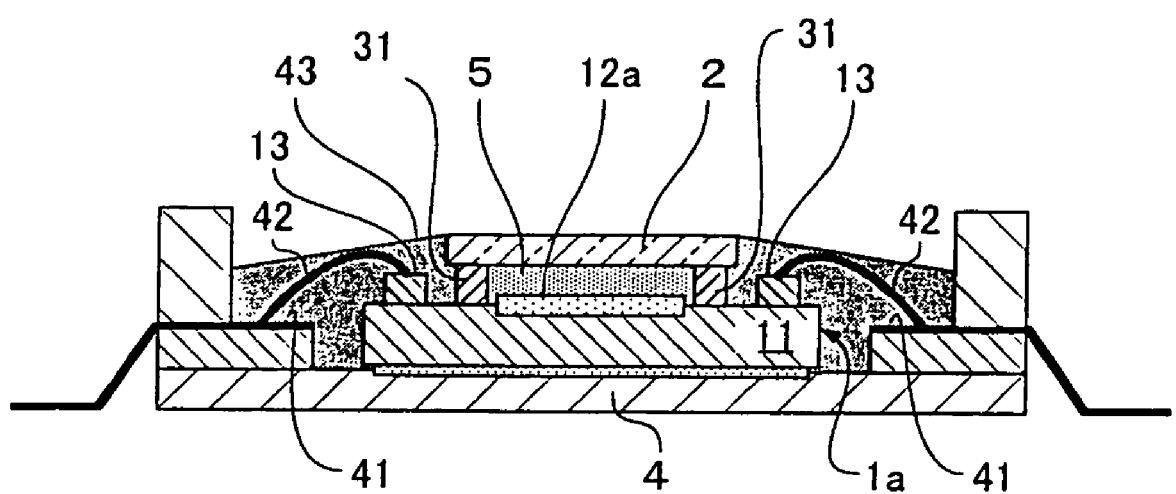
FIG. 1 is a sectional view showing the configuration of a solid-state image device according to the present invention.
Figure 2:
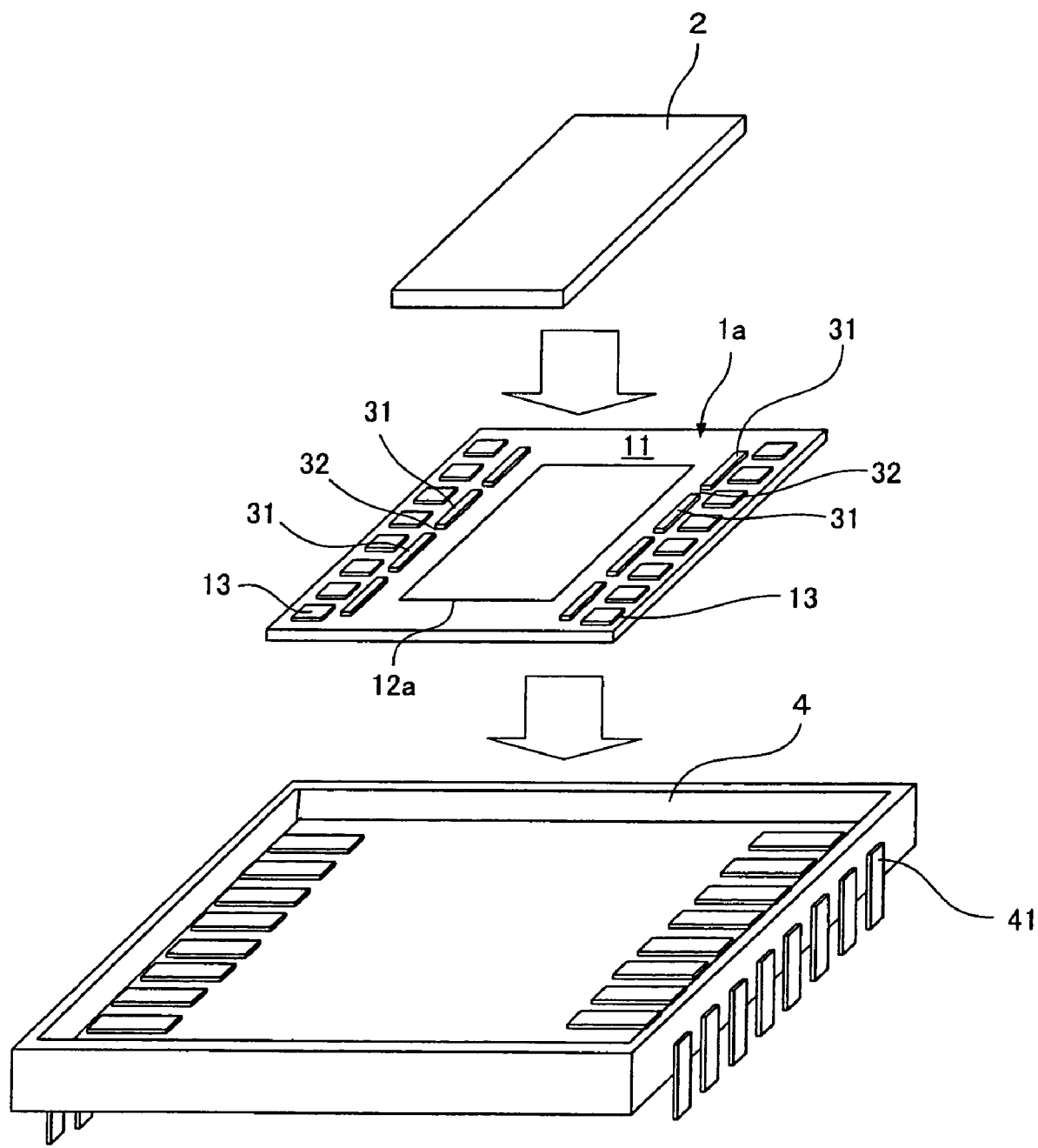
FIG. 2 is an exploded perspective view schematically showing the configuration of the solid-state image device shown in FIG. 1.
Figure 3A:
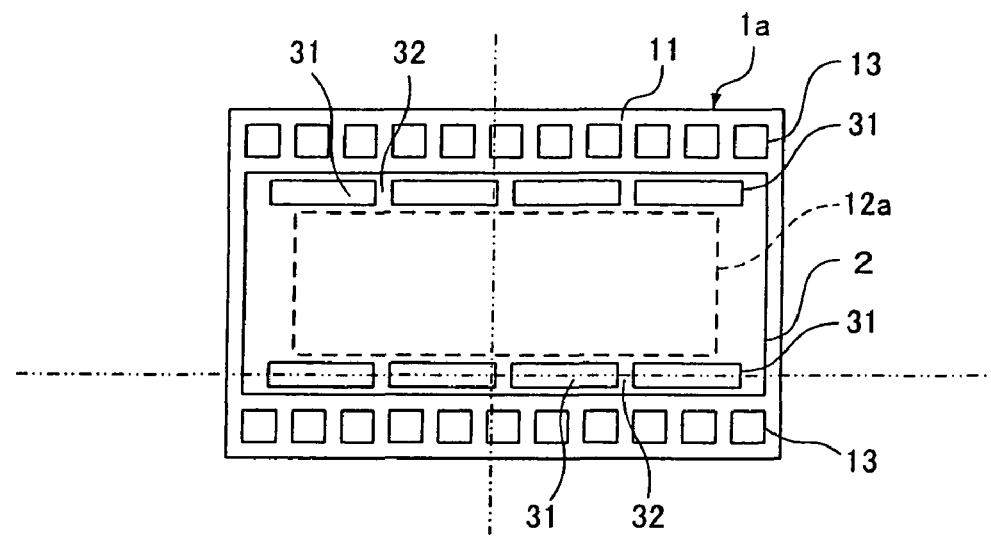
FIGS. 3A to 3C are a plan view and sectional views schematically showing the configuration of the solid-state image device shown in FIG. 1.
Figure 3B:
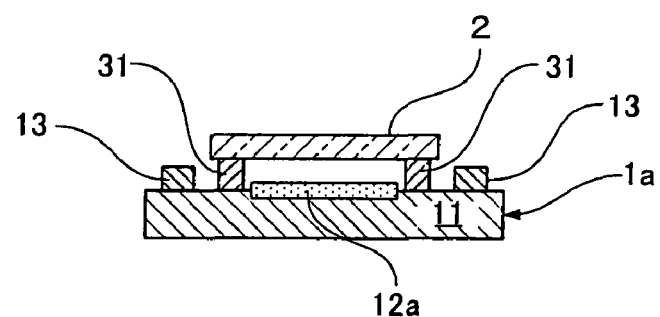
Figure 3C:
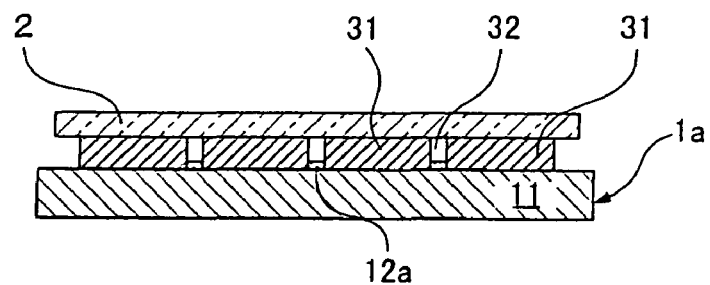

A solid-state image device shown in FIGS. 1 to 3 includes a solid-state image element 1a, a translucent plate 2, and a recessed substrate 4. The solid-state image element 1a has a light receiving part 12a formed at the center of a semiconductor substrate 11 and a plurality of electrodes 13 formed on the ends of the substrate. The translucent plate 2 is bonded on the light receiving part 12a with a translucent adhesive 5. The electrodes 13 of the solid-state image element 1a and leads 41 provided on the substrate 4 are connected to each other via wires 42. The substrate 4 is filled with light-shielding resin 43, other than the top surface of the translucent plate 2. In FIGS. 2 and 3, the illustration of some members is omitted to facilitate understanding.

Inside the formation regions of the electrodes 13 on the semiconductor substrate 11, a plurality of convex portions 31 are disposed with proper gaps 32 along the ends of the light receiving part 12a. The convex portions 31 are rectangular in plan view and are arranged along a pair of opposite sides of the light receiving part 12a. The length of the arrangement of the convex portions 31 is longer than the corresponding sides of the light receiving part 12a and is shorter than the corresponding sides of the translucent plate 2. Both ends of the arrangement of the convex portions 31 are disposed inside the other sides of the translucent plate 2, the sides being orthogonal to the arrangement direction of the convex portions 31.

The convex portions 31 are evenly high enough to hold back the translucent adhesive 5 supplied as a liquid over the light receiving part 12a. The gaps 32 between the convex portions 31 have dimensions not substantially allowing the translucent adhesive 5 to flow. The heights and gaps of the convex portions 31 are larger than the diameters of expected voids. For example, the translucent plate 2 is 5 mm to 12 mm in length, 4 mm to 11 mm in width, and 0.3 mm to 1 mm in thickness. When 0.3 mg to 2 mg of a UV curing acrylic adhesive is applied as the translucent adhesive 5, the convex portions 31 are 8 to 1 mm in height and the gaps 32 are 1 μm to 10 mm in width.

Referring to FIG. 4, a method of manufacturing the solid-state image device will now be described.

Figure 4A:
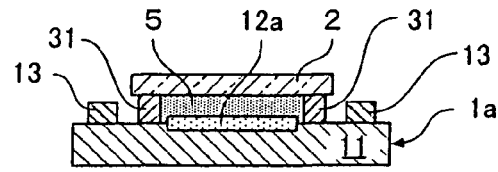
FIGS. 4A to 4D are process sectional views for explaining a method of manufacturing the solid-state image device shown in FIG. 1.

As shown in FIG. 4A, the solid-state image element 1a and the translucent plate 2 are integrally formed. For this configuration, the plurality of solid-state image elements 1a are formed as a wafer. The plurality of convex portions 31 are formed on the semiconductor substrate 11 for each of the solid-state image elements 1a. The convex portions 31 are formed as follows: for example, a photosensitive material such as acrylate is applied to form an acrylate mask, only portions to be formed as the convex portions 31 are cured using photolithography, and the other portions are removed using an organic agent. Thereafter, the liquid translucent adhesive 5 is applied on the light receiving part 12a for each of the solid-state image elements 1a, the translucent plate 2 is placed on the convex portions 31, and the translucent adhesive 5 is cured to bond the translucent plate 2 over the light receiving part 12a. Finally, each of the solid-state image elements 1a is diced.

Figure 4B:
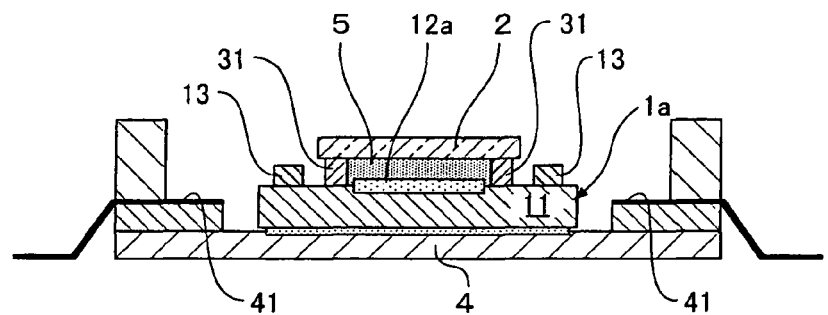
Figure 4C:
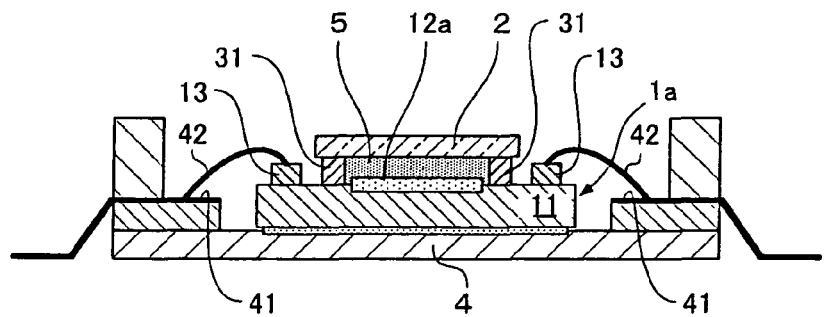
Figure 4D:
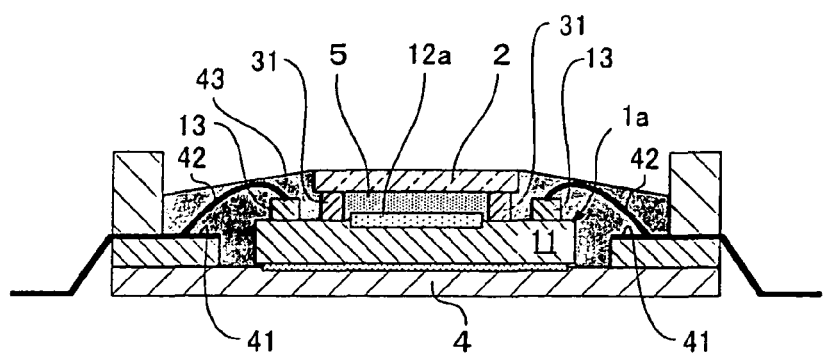

The solid-state image element 1a having been divided thus with the translucent plate 2 bonded thereon is die bonded to the substrate 4 and is bonded to the leads 41 of the substrate 4 via the wires 42 as shown in FIGS. 4B to 4D. Thereafter, the substrate 4 is filled with the light-shielding resin 43, other than the top surface of the translucent plate 2.

The solid-state image device configured thus has a directly bonded structure in which the translucent plate 2 is directly bonded to the light receiving part 12a of the semiconductor substrate 11. Thus, it is possible to increase sensitivity, reduce the size and thickness of a package, and prevent dust from entering the light receiving part 12a. Further, the convex portions 31 can regulate a gap between the translucent plate 2 and the light receiving part 12a to precisely perform positioning, and hold back the flow of the translucent adhesive 5 to the electrodes 13. The gaps 32 between the convex portions 31 have the proper widths not allowing the translucent adhesive 5 to flow out of the convex portions 31; meanwhile the gaps 32 can release air trapped in the translucent adhesive 5 and suppress internal voids.

Figure 5:
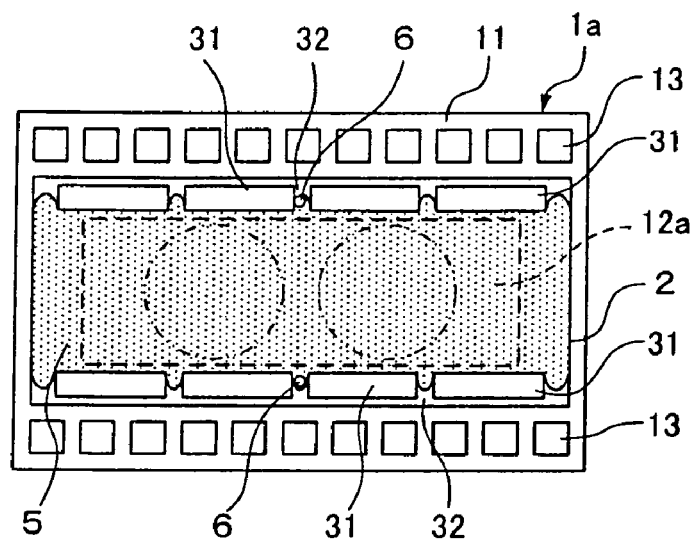
FIG. 5 is a schematic view showing the expansion of a translucent adhesive supplied by a two-point application method during the manufacturing of the solid-state image device shown in FIG. 1.

The following will describe a method of supplying the translucent adhesive 5. The solid-state image device uses a method of applying the liquid translucent adhesive 5 onto the light receiving part 12a before the translucent plate 2 is placed on the convex portions 31 of the semiconductor substrate 11. In this case, when using a two-point application method of applying the translucent adhesive 5 to two points indicated by virtual lines in FIG. 5, a region where the translucent adhesive 5 is pressed and extended by the translucent plate 2 on each point is smaller than the region of a single-point application method. Thus, the translucent adhesive 5 is held inside the rows of the convex portions 31. Air between the translucent adhesive 5 on the two points is released from the gaps 32 between the convex portions 31. As shown in FIG. 5, even when voids 6 are generated by air trapped in the translucent adhesive 5, the voids 6 are released as the translucent adhesive 5 enters the gaps 32, so that the voids 6 are not left on the light receiving part 12a. Since the gaps 32 are set as described above, surface tension acts on the translucent adhesive 5 having entered the gaps 32 and prevents the translucent adhesive 5 from flowing out of the convex portions 31. Therefore, it is possible to prevent the translucent adhesive 5 from being pressed out of the convex portions 31.

Figure 6:
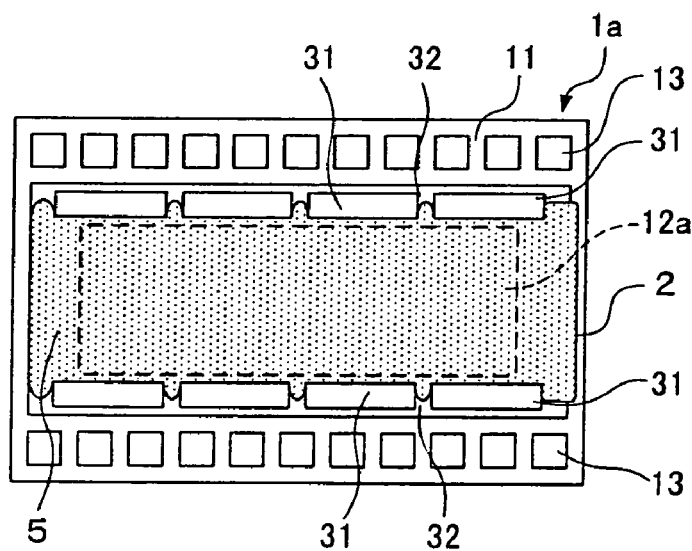
FIG. 6 is a schematic view showing the expansion of the translucent adhesive supplied by an underfill method during the manufacturing of the solid-state image device shown in FIG. 1.

FIG. 6 shows a state in which the translucent adhesive 5 is supplied by an underfill method. After the translucent plate 2 is placed on the convex portions 31 of the semiconductor substrate 11, the translucent adhesive 5 is flown between the semiconductor substrate 11 and the translucent plate 2 by using a capillary phenomenon. As described above, the length of the arrangement of the convex portions 31 is shorter than the corresponding sides of the translucent plate 2, and both ends of the arrangement of the convex portions 31 are disposed inside the other sides of the translucent plate 2, the sides being orthogonal to the arrangement direction of the convex portions 31. Because of the surface tension, the translucent adhesive 5 flows onto the light receiving part 12a without flowing out of the translucent plate 2. As in the two-point application method, generated voids are released from the gaps 32 and are not left on the light receiving part 12a, and the translucent adhesive 5 does not flow out of the convex portions 31 through the gaps 32.

Figure 7:
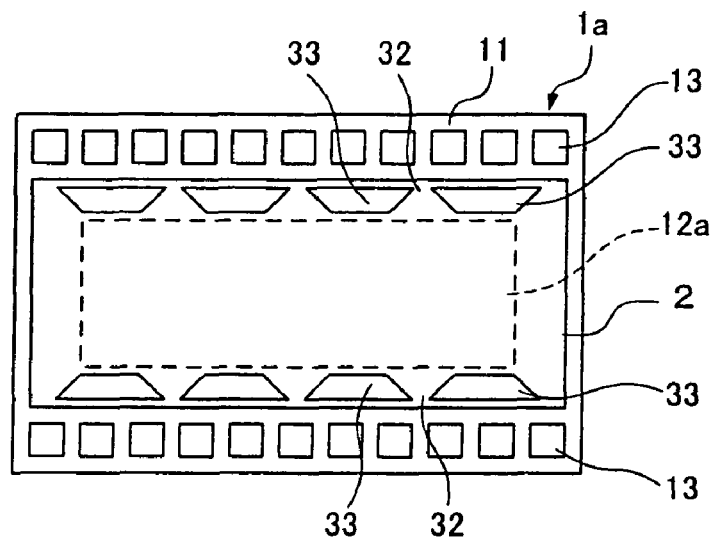
FIG. 7 is a plan view schematically showing the configuration of another solid-state image device according to the present invention.

In a solid-state image device shown in FIG. 7, convex portions 33 are shaped like trapezoids each having a side facing a light receiving part 12a and the side is shorter than the other side in plan view. Since gaps 32 between the convex portions 33 are tapered, a translucent adhesive 5 supplied by any one of the two-point application method and the underfill method allows most of air between a semiconductor substrate 11 and a translucent plate 2 to gather at the gaps 32 and escape to the outside of the convex portions 33. Thus, it is possible to prevent voids on the light receiving part 12a with higher reliability. The other configurations are similar to the configurations of the solid-state image device of FIG. 1 and the same effect can be obtained.

Figure 8:
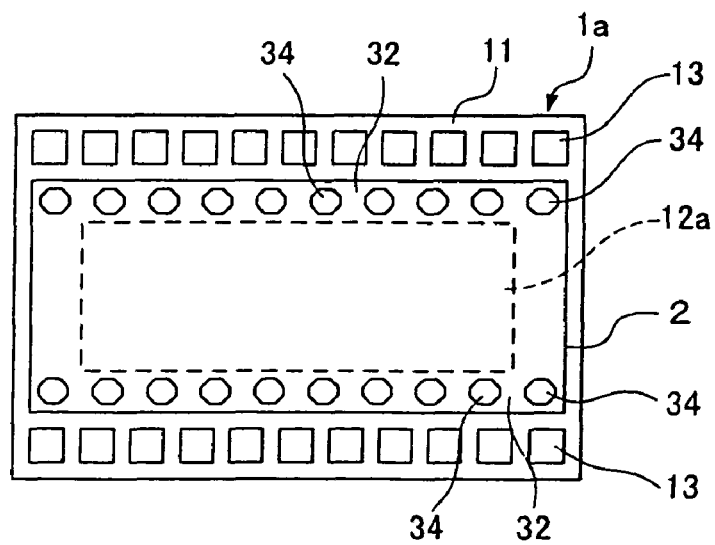
FIG. 8 is a plan view schematically showing the configuration of still another solid-state image device according to the present invention.

In a solid-state image device of FIG. 8, convex portions 34 are smaller than the convex portions 31 of FIG. 1 and the number of convex portions 34 is larger than the number of convex portions 31. The convex portions 34 have round top surfaces, and thus voids move faster at gaps 32 between the convex portions 34 and are easily released to the outside of the convex portions 34. Other configurations are similar to the configurations of the solid-state image device of FIG. 1 and the same effect can be obtained.

Figure 9A:
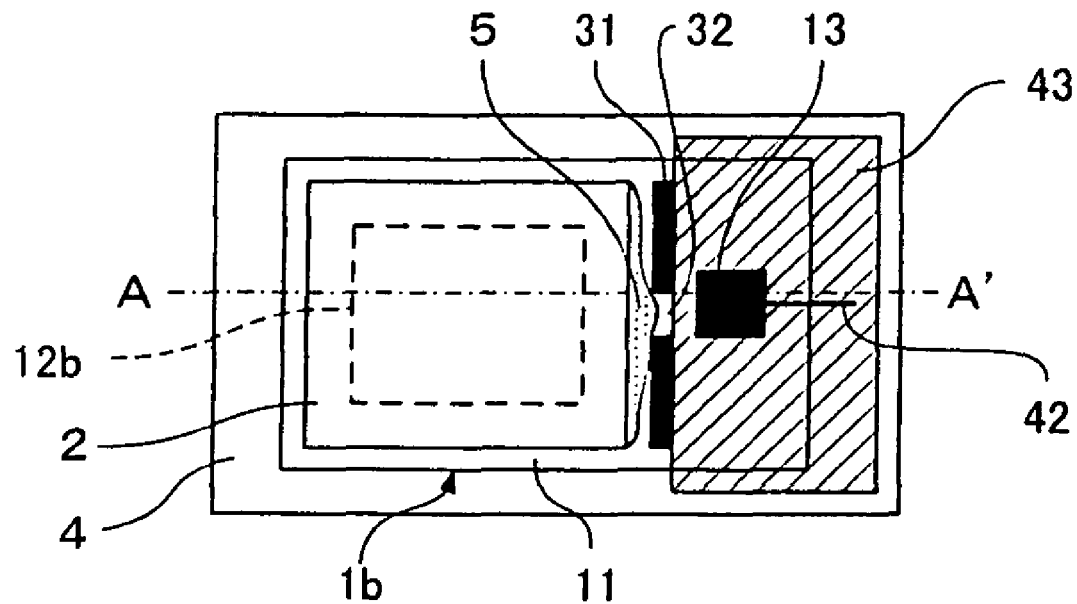
FIGS. 9A and 9B are a plan view and a sectional view showing the configuration of an LED device according to the present invention.
Figure 9B:
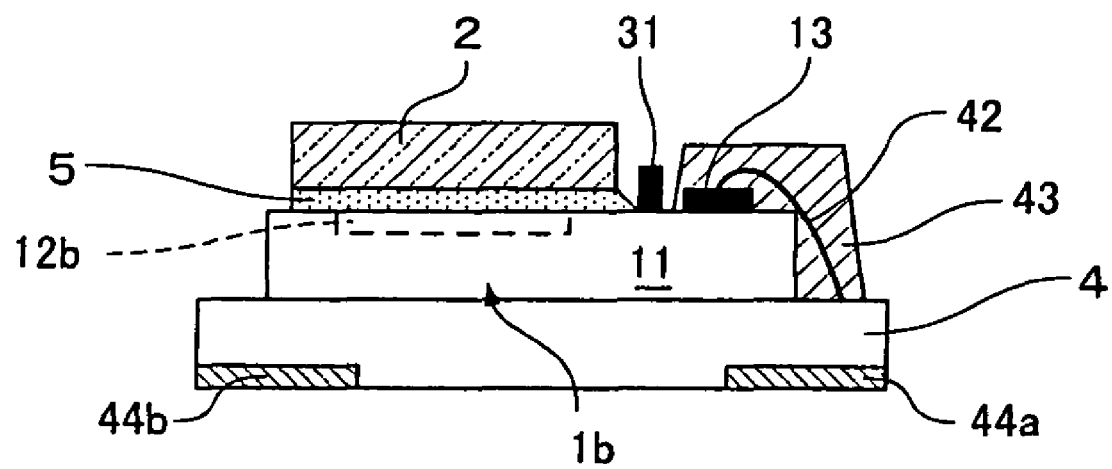
Figure 10:
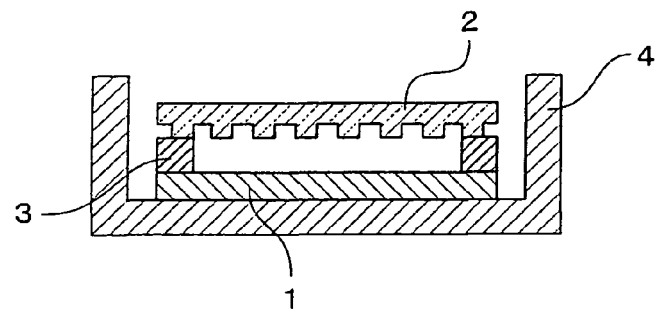
FIG. 10 is a sectional view showing a solid-state image device of the prior art.
Figure 11:
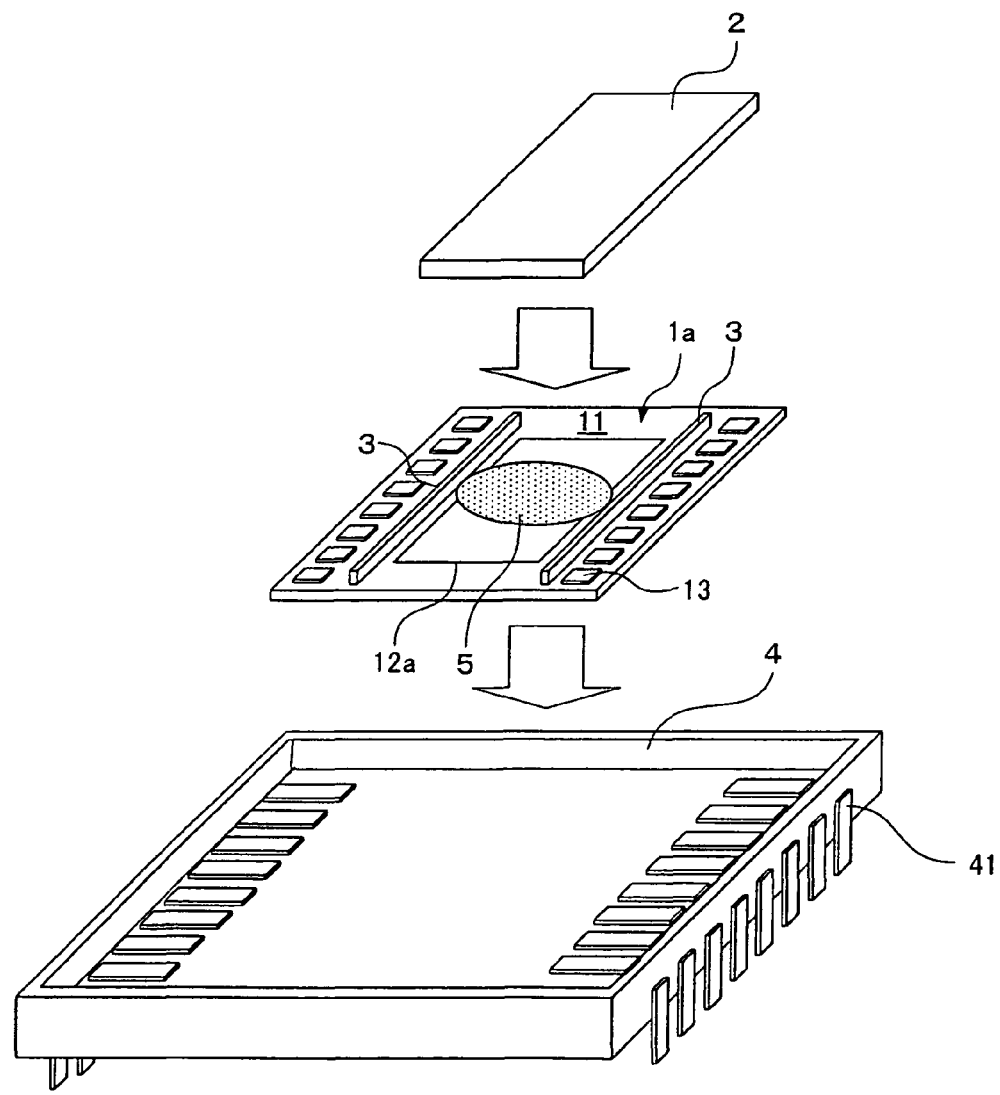
FIG. 11 is an exploded perspective view schematically showing another solid-state image device of the prior art.
Figure 12A:
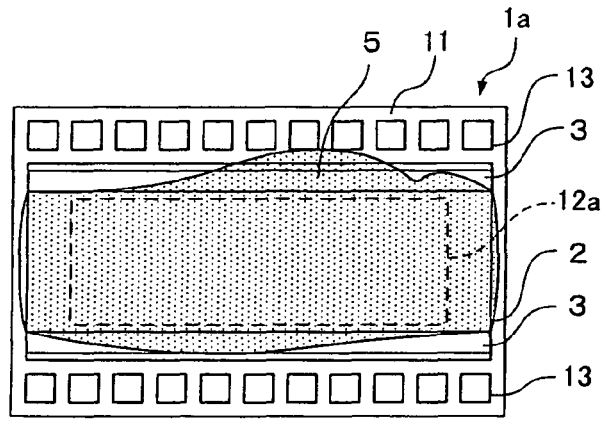
FIGS. 12A and 12B are schematic views showing the expansion of a translucent adhesive supplied by an application method during the manufacturing of the solid-state image device shown in FIG. 11.
Figure 12B:
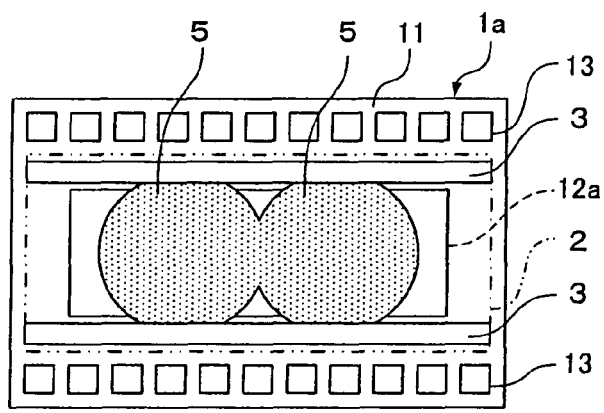
Figure 13:
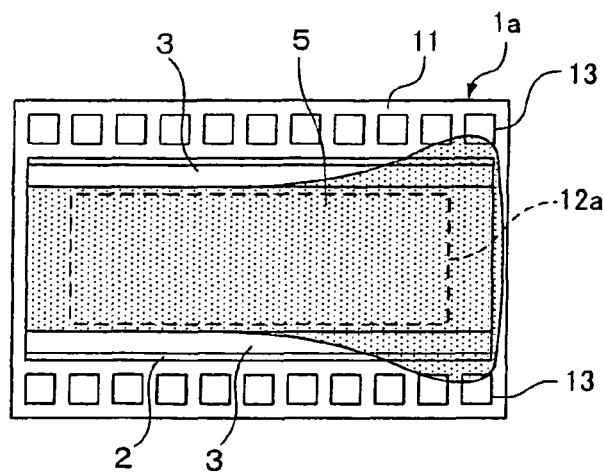
FIG. 13 is a schematic view showing the expansion of the translucent adhesive supplied by the underfill method during the manufacturing of the solid-state image device shown in FIG. 11.

An LED device shown in FIG. 9 includes an LED element 1b, a translucent plate 2, and a substrate 4. In the LED device 1b, a light emitting part 12b is formed close to one end of a semiconductor substrate 11 and an electrode 13 is formed close to the other end. Between the light emitting part 12b and the electrode 13, rectangular convex portions 31 are disposed along one side of the light emitting part 12b in plan view. The translucent plate 2 is bonded on the light emitting part 12b with a translucent adhesive 5 without being placed on the convex portions 31.

The length of the arrangement of the convex portions 31 is longer than the corresponding sides of the light emitting part 12b and is substantially equal to the lengths of the corresponding sides of the translucent plate 2. Both ends of the arrangement of the convex portions 31 are disposed inside the other sides of the translucent plate 2, the sides being orthogonal to the arrangement direction of the convex portions 31. The convex portions 31 are evenly high enough to hold back the translucent adhesive 5 supplied as a liquid over the light emitting part 12b. A gap 32 between the convex portions 31 has dimensions not substantially allowing the translucent adhesive 5 to flow. The heights and gap of the convex portions 31 are larger than the diameters of expected voids. Reference numerals 44a and 44b denote external terminals provided on the substrate 4.

As in the solid-state image device of FIG. 1, the LED device can obtain the effect of the directly bonded structure of the translucent plate 2 to the light emitting part 12b. Further, as in the solid-state image device of FIG. 1, the convex portions 31 release generated voids from the gap 32 and do not leave the voids on the light emitting part 12b, and the translucent adhesive 5 does not flow out of the convex portions 31 through the gap 32.

As described above, according to the optical device of the present invention, the plurality of convex portions are formed beforehand with the gaps on the semiconductor substrate on which the translucent plate is directly bonded with the translucent adhesive. Thus, the translucent adhesive supplied by any one of the two-point application method and the underfill method can release air trapped in the translucent adhesive and suppress internal voids. The gaps having proper widths allow surface tension to act on the translucent adhesive flowing into the gaps and thus the translucent adhesive does not flow out of the convex portions.

Both ends of the arrangement of the convex portions are disposed inside the end sides of the translucent plate, the end sides being orthogonal to the arrangement direction of the convex portions. Thus, it is possible to prevent the translucent adhesive from flowing out of the convex portions when the underfill method is used. The convex portions can also regulate a gap between one of the light receiving part and the light emitting part and the translucent plate.

Optical devices achieving the same effect by using the directly bonded structure and the arrangement of the convex portions include a solid-state image element (such as a CCD), a light emitting element (LED, semiconductor laser), and a light receiving element (photodiode, phototransistor).

A solid-state image element is used for a camera module and so on mounted in a digital camera, a mobile phone, and an onboard camera. An LED is used for the luminous display, illumination module, and so on of a mobile phone. A semiconductor laser is used for BD, DVD, and CD-ROM drives and so on.

What is claimed is:

1. A method of manufacturing an optical device, comprising:
   preparing a semiconductor substrate having a light receiving part and an array of electrodes thereon;
   forming a plurality of convex portions located between the light receiving part and the array of electrodes, and arranged intermittently along an entire side of the light receiving part facing the array of electrodes;
   applying a liquid transparent adhesive onto the light receiving part of the semiconductor substrate;
   positioning a translucent member on the light receiving part of the semiconductor substrate; and
   bonding the translucent member to the light receiving part by curing the translucent adhesive filling a space between the translucent member, the light receiving part and an inside portion of the plurality of the convex portions, the transparent adhesive in at least one space between convex portions.

2. The method of manufacturing an optical device according to claim 1, wherein the translucent member has a four-sided shape having two first sides and two second sides, respectively, facing each other, and the plurality of convex portions is inward of the first sides.

3. The method of manufacturing an optical device according to claim 1, wherein each of the convex portions has a side facing the light receiving part and in plan view the side is shorter than another side of the convex portion.

4. The method of manufacturing an optical device according to claim 1, wherein each of the convex portions has a round top surface.

5. The method of manufacturing an optical device according to claim 1, wherein the convex portions are arranged along at least two sides of the light receiving part and they have even heights, and the translucent member is on the light receiving part via the plurality of convex portions.

6. A method of manufacturing an optical device, comprising:
   preparing a semiconductor substrate having a light emitting part and an array of electrodes thereon;
   forming a plurality of convex portions located between the light emitting part and the array of electrodes, and arranged intermittently along an entire side of the light emitting part facing the array of electrodes;
   applying a liquid transparent adhesive onto the light emitting part of the semiconductor substrate;
   positioning a translucent member on the light emitting part of the semiconductor substrate; and
   bonding the translucent member to the light emitting part by curing the transparent adhesive filling a space between the translucent member, the light emitting part and an inside portion of the plurality of the convex portions, the transparent adhesive in at least one space between convex portions.

7. The method of manufacturing an optical device according to claim 6, wherein the translucent member has a four-sided shape having two first sides and two second sides, respectively, facing each other, and the plurality of convex portions is inward of the first sides.

8. The method of manufacturing an optical device according to claim 6, wherein each of the convex portions has a side facing the light emitting part and in plan view the side is shorter than another side of the convex portion.

9. The method of manufacturing an optical drive according to claim 6, wherein each of the convex portions has a round top surface.

10. The method of manufacturing an optical device according to claim 6, wherein the convex portions are arranged along at least two sides of the light emitting part and they have even heights, and the translucent member is on the light emitting part via the plurality of convex portions.

* * * * *

UNITED STATES PATENT AND TRADEMARK OFFICE
CERTIFICATE OF CORRECTION

| | | |
|---|---|---|
| PATENT NO. | : 7,977,138 B1 | Page 1 of 1 |
| APPLICATION NO. | : 12/929795 | |
| DATED | : July 12, 2011 | |
| INVENTOR(S) | : Meng et al. | |

It is certified that error appears in the above-identified patent and that said Letters Patent is hereby corrected as shown below:

Title Page, item 75, should read:

--Inventors: Hu Meng, Osaka (JP); Hiroto Osaki, Kyoto (JP); Tetsushi Nishio, Kyoto (JP); Kiyokazu Itoi, Kyoto (JP)--

Signed and Sealed this
Eighteenth Day of October, 2011

David J. Kappos
*Director of the United States Patent and Trademark Office*